United States Patent
Ki

(10) Patent No.: US 11,754,925 B2
(45) Date of Patent: Sep. 12, 2023

(54) METHODS AND APPARATUS FOR FORMING RESIST PATTERN USING EUV LIGHT WITH ELECTRIC FIELD

(71) Applicant: SK hynix Inc., Gyeonggi-do (KR)

(72) Inventor: Bu Geun Ki, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 41 days.

(21) Appl. No.: 17/443,741

(22) Filed: Jul. 27, 2021

(65) Prior Publication Data
US 2022/0244646 A1    Aug. 4, 2022

(30) Foreign Application Priority Data
Feb. 3, 2021   (KR) .................. 10-2021-0015733

(51) Int. Cl.
| | | |
|---|---|---|
| G03F 7/20 | (2006.01) | |
| G03F 7/00 | (2006.01) | |
| H01L 21/027 | (2006.01) | |

(52) U.S. Cl.
CPC .............. *G03F 7/203* (2013.01); *G03F 7/707* (2013.01); *G03F 7/70033* (2013.01); *H01L 21/0274* (2013.01)

(58) Field of Classification Search
CPC ...... G03F 7/203; G03F 7/70033; G03F 7/707; G03F 7/091; G03F 7/093; G03F 7/11; G03F 7/164; G03F 7/168; H01L 21/0274
See application file for complete search history.

(56) References Cited

U.S. PATENT DOCUMENTS

| | | | |
|---|---|---|---|
| 5,258,266 A * | 11/1993 | Tokui | G03F 7/38 430/326 |
| 6,841,342 B2 * | 1/2005 | Nishi | G03F 7/38 438/758 |
| 8,586,269 B2 | 11/2013 | Okoroanyanwu et al. | |
| 2005/0074706 A1 * | 4/2005 | Bristol | G03F 7/093 430/311 |
| 2005/0231704 A1 * | 10/2005 | Mickan | G03F 7/70941 355/69 |
| 2008/0030692 A1 * | 2/2008 | Wang | G03F 7/0397 430/311 |
| 2012/0103939 A1 * | 5/2012 | Wu | H01J 37/32192 216/70 |
| 2014/0193755 A1 * | 7/2014 | Wise | G03F 7/70325 355/72 |
| 2014/0327894 A1 * | 11/2014 | Koh | G03F 7/2022 355/53 |
| 2019/0287792 A1 * | 9/2019 | Park | H01L 21/0274 |
| 2020/0019070 A1 * | 1/2020 | Weng | G03F 7/70708 |
| 2021/0217583 A1 * | 7/2021 | Denbeaux | H01L 21/0274 |

* cited by examiner

*Primary Examiner* — Deoram Persaud
(74) *Attorney, Agent, or Firm* — IP & T GROUP LLP

(57) ABSTRACT

A method and apparatus for forming a resist pattern may be provided. In the method for forming a resist pattern, a resist layer may be formed on a base layer, an electric field may be applied to the resist layer in a thickness direction of the resist layer, and a portion of the resist layer may be exposed with extreme ultraviolet (EUV) light while applying the electric field. A lithography apparatus for performing the method of forming a resist pattern may include at least an exposure part and an electric field forming part. The exposure part may be configured to expose a portion of the resist layer with extreme ultraviolet (EUV) light. The electric field forming part may be configured to apply an electric field to the resist layer.

17 Claims, 21 Drawing Sheets

US 11,754,925 B2

METHODS AND APPARATUS FOR FORMING RESIST PATTERN USING EUV LIGHT WITH ELECTRIC FIELD

CROSS-REFERENCE TO RELATED APPLICATIONS

The present application claims priority under 35 U.S.C 119(a) to Korean Application No. 10-2021-0015733, filed on Feb. 3, 2021, which is incorporated herein by reference in its entirety.

BACKGROUND

1. Technical Field

The present disclosure relates to semiconductor technology and, more particularly, to a method and an apparatus for forming a resist pattern using extreme ultraviolet light (EUV) and an electric field.

2. Related Art

Lithography techniques are being used to form desired patterns on a wafer or a substrate. A semiconductor device is fabricated by forming a pattern on a substrate by a lithography process and etching a material layer using the formed pattern as an etch mask. As the integration degree of semiconductor devices increases, the required pattern size becomes smaller and finer. In order to form a fine pattern, it is required to use EUV light in a lithography process. The EUV light has a wavelength of substantially 13.5 nm.

In a lithography process using a wavelength of EUV, a phenomenon in which the line width roughness (LWR) or line edge roughness (LER) of a resist pattern is increased has been observed. Efforts are being made to improve the line width roughness (LWR) and line edge roughness (LER) of the resist pattern.

SUMMARY

An embodiment of the present invention disclosure (also referred to hereinafter simply as disclosure) provides a method of forming a resist pattern. The method may include forming a resist layer on a base layer, applying an electric field to the resist layer in a thickness direction of the resist layer, and exposing a portion of the resist layer to extreme ultraviolet (EUV) light while applying the electric field.

Another embodiment of the disclosure provides a method of forming a resist pattern. The method may include forming a first electrode layer on a base layer, forming a resist layer on the first electrode layer, forming a second electrode layer on the resist layer, applying a potential difference between the first and second electrode layers to apply an electric field to the resist layer in a thickness direction of the resist layer, and exposing a portion of the resist layer with extreme ultraviolet (EUV) light while applying the electric field.

Another embodiment of the disclosure provides an apparatus for forming a resist pattern. The apparatus may include a chuck part configured to hold a base layer including a resist layer formed thereon, an exposure part configured to expose a portion of the resist layer with extreme ultraviolet (EUV) light, and an electric field forming part configured to apply an electric field to the resist layer in a thickness direction of the resist layer.

Another embodiment of the disclosure provides an apparatus for forming a resist pattern. The apparatus may include a chuck part configured to hold a base layer including a first electrode layer, a resist layer, and a second electrode layer formed thereon, an exposure part configured to expose a portion of the resist layer with extreme ultraviolet (EUV) light, and an electric field forming part configured to apply a potential difference between the first and second electrode layers to apply an electric field to the resist layer in a thickness direction of the resist layer.

DETAILED DESCRIPTION

Figure 1:
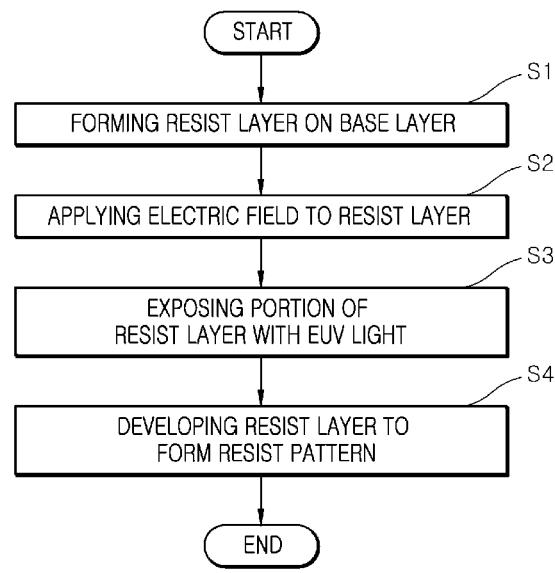
FIG. 1 illustrates a method of forming a resist pattern according to an embodiment of the present disclosure.

The terms used herein may correspond to words selected in consideration of their functions in the present embodiments, and the meanings of the terms may be construed to be different according to those of ordinary skill in the art to which the embodiments belong. When a term is defined in detail, then the term should be construed according to its definition. However, unless otherwise defined, the terms (including technical and scientific terms) used herein have the same meaning as commonly understood by one of ordinary skill in the art to which the embodiments belong.

In the description of the embodiments of the present disclosure, descriptions such as "first" and "second," "upper" and "lower," and "left" and "right" are for distinguishing members, and are not used to limit the members themselves or to mean a specific order, but to refer to relative positional relationships, and do not limit the specific case in which the member is directly in contact or another member is further introduced into the interface between them. The same interpretation may be applied to other expressions describing the relationship between components.

The embodiments of the present disclosure may be applied to a technical field for implementing integrated circuits such as dynamic random access memory (DRAM) devices, phase change random access memory (PcRAM) devices, or resistive random access memory (ReRAM) devices. In addition, the embodiments of the present disclosure may be applied to a technical field of implementing memory devices such as static random access memory (SRAM) devices, NAND-type flash memory devices, NOR-type flash memory devices, magnetic random access memory (MRAM) devices, or ferroelectric random access memory (FeRAM) devices, or logic devices in which integrated logic circuits are integrated. The embodiments of the present disclosure may be applied to a technical field for implementing various products requiring fine patterns.

Same reference numerals refer to same devices throughout the specification. Even though a reference numeral might not be mentioned or described with reference to a drawing, the reference numeral may be mentioned or described with reference to another drawing. In addition, even though a reference numeral might not be shown in a drawing, it may be shown in another drawing.

FIG. 1 is a schematic flowchart illustrating a method of forming a resist pattern according to an embodiment of the present disclosure.

Referring to FIG. 1, the method of forming a resist pattern according to an embodiment may be performed to expose a portion of a resist layer using EUV light while applying an electric field to the resist layer. Specifically, the resist layer may be formed on a base layer (S1). The resist layer may be a layer containing a resist material that can be exposed to EUV light. The base layer may be a lower layer positioned under the resist layer. The base layer may include an etching target layer to be selectively etched according to a shape of the resist pattern in a selective etching process using the resist pattern as an etching mask. The base layer may include a layer of a dielectric material, a layer of a conductive material, or a layer of a metal material. The base layer may include a substrate or a wafer on which semiconductor devices are to be integrated.

An electric field may be applied to the resist layer (S2). The electric field may be applied to the resist layer while having a potential difference in a thickness direction of the resist layer. The electric field may be formed to have an electric field direction in a direction substantially perpendicular to a surface of the resist layer. The electric field direction may be a direction substantially vertically passing through the resist layer. As the electric field is applied to the resist layer, a potential difference may be applied between a bottom surface of the resist layer and a top surface opposite thereto.

A portion of the resist layer may be exposed by EUV light (S3). While the electric field is applied to the resist layer, an exposure process using the EUV light may be performed to the resist layer to which the electric field is applied. The EUV light may be irradiated to the resist layer in a direction substantially perpendicular to the resist layer. The EUV light may transfer a pattern image of a photomask to the resist layer. The EUV light may be selectively irradiated to only a portion of the resist layer so that the pattern image of the photomask may be transferred to the resist layer as a latent image. In an embodiment, the EUV light may have a wavelength band of approximately 13.5 nm.

The resist layer may be developed to form a resist pattern (S4). By developing the resist layer including the portion exposed by EUV light, a resist pattern may be implemented in a shape that follows the pattern image of the photomask. Before developing the resist layer, a process of post-baking the exposed resist layer may be further performed.

Figure 2:
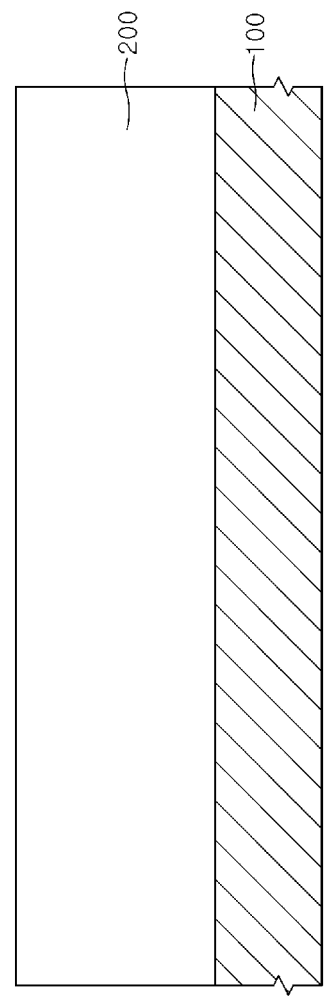
FIGS. 2 to 5 illustrate a method of forming a resist pattern of FIG. 1.

FIG. 2 is a schematic cross-sectional view illustrating an operation (S1) of forming the resist layer 200.

Referring to FIGS. 2 and 1, the resist layer 200 may be formed on the base layer 100 (S1). The base layer 100 may be disposed below the resist layer 200. The base layer 100 may include a semiconductor substrate or a semiconductor wafer. The base layer 100 may include a layer of a dielectric material, a layer of a conductive material, or a layer of a metal material formed on a semiconductor substrate or a semiconductor wafer.

The resist layer 200 may be formed by spin coating a resist material on the base layer 100. The resist layer 200 may include a photosensitive resist material, for example a negative resist material, capable of being sensitized to EUV light. The resist material may include a photosensitizer and a resin. The photosensitizer may include a material capable of being sensitized to EUV light. The resist material may include a metal oxide material or an organometallic compound. The organometallic compound may include a compound in which the photosensitive ligand is bonded to a metal atom or metal oxide. The resist material may include an organic resist material or an inorganic resist material. In an embodiment, the resist layer 200 may be formed to have a thickness of approximately 100 nm. In an embodiment, the resist layer 200 may be formed to have a different thickness, for example, of approximately 5 nm to 100 nm.

Figure 3:
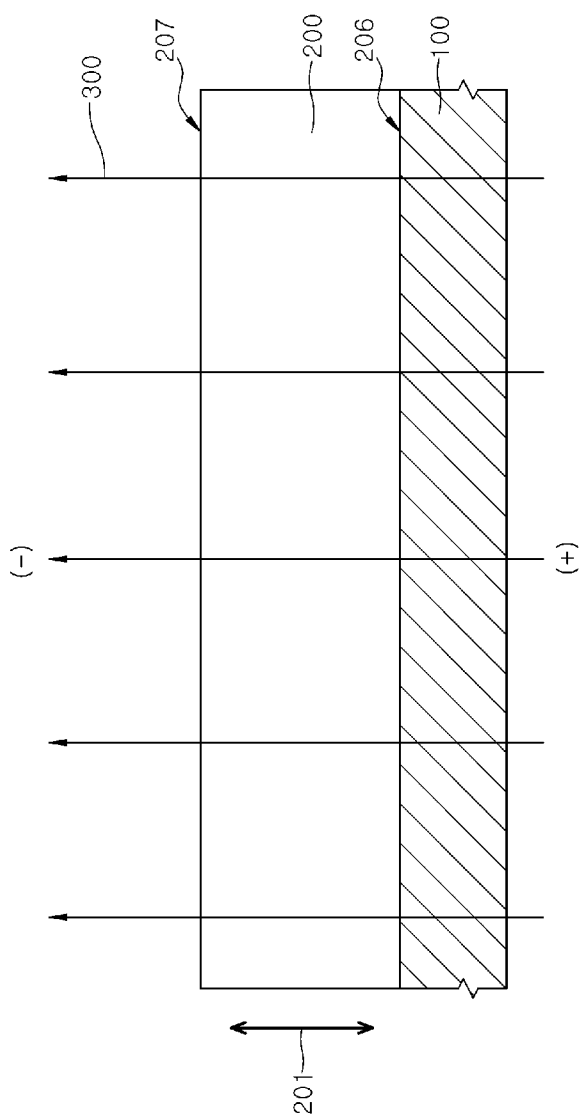

FIG. 3 is a schematic cross-sectional view illustrating an operation (S2) of applying an electric field 300 in FIG. 1.

Referring to FIGS. 3 and 1, the electric field 300 may be applied to the resist layer 200 (S2). The electric field 300 may be applied to the resist layer 200 to have an electric field direction substantially along the thickness direction 201 of the resist layer 200. The thickness direction 201 may also be the direction of stacking the resist layer 200 on the base layer 100. The thickness direction 201 of the resist layer 200 may be a direction from a bottom surface 206 of the resist layer 200 to a top surface 207 of the resist layer 200 opposite to the bottom surface 206 or a direction from the top surface 207 to the bottom surface 206 of the resist layer 200.

The electric field 300 may be applied so that the bottom surface 206 of the resist layer 200 has a positive potential with respect to the top surface 207 and the electric field 300 has the electric field direction substantially perpendicular to the resist layer 200. In a variation of the described embodiment, the electric field 300 may be applied so that the bottom surface 206 of the resist layer 200 has a negative potential with respect to the top surface 207 and the electric field 300 has the electric field direction substantially perpendicular to the resist layer 200. By introducing the base layer 100 or the substrate on which the resist layer 200 is formed in the electric field 300, the electric field 300 may be applied to the resist layer 200.

Figure 4:
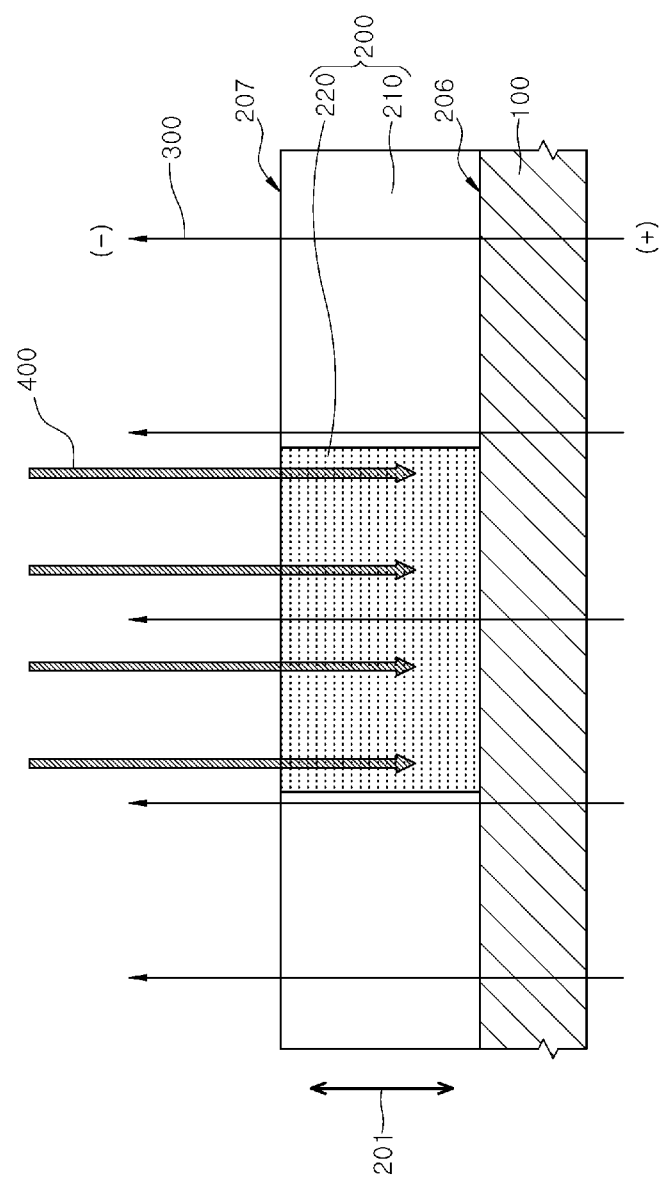

FIG. 4 is a schematic cross-sectional view illustrating an operation (S3) of exposing the resist layer 200 of FIG. 1 with EUV light 400.

Referring to FIGS. 4 and 1, while the electric field 300 is applied to the resist layer 200, the EUV light 400 may be irradiated to the resist layer 200 to expose the resist layer 200 (S3). The exposure process may be performed so that the EUV light 400 is selectively irradiated to an exposed region 220, which is a partial region of the resist layer 200, and is not irradiated to a non-exposed region 210, which is another partial region of the resist layer 200.

Figure 5:
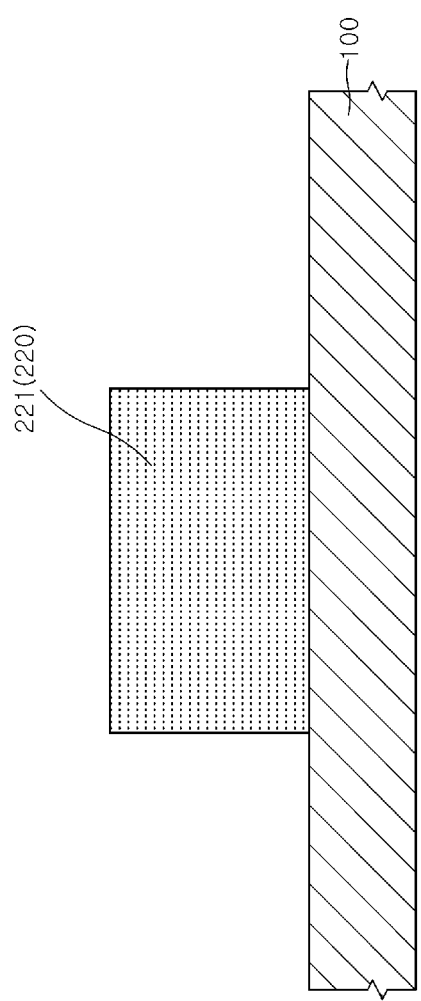

FIG. 5 is a schematic cross-sectional view illustrating an operation (S4) of forming a resist pattern 221 in FIG. 1.

Referring to FIGS. 5 and 1, the exposed resist layer 200 may be developed to form the resist pattern 221 (S4). Before developing the exposed region 220 of the resist layer 200, the resist layer 200 may be post-baked. Thereafter, the non-exposed region (210 of FIG. 4) of the resist layer 200 may be developed and removed. Accordingly, the exposed region 220 of the resist layer 200 may be patterned and remain as the resist pattern 221. FIG. 5 illustrates a case where the resist layer 200 is made of a negative resist material. When the resist layer 200 is made of a positive resist material, the exposed region of the exposed resist layer may be removed by development and the non-exposed region may remain as a resist pattern.

Figure 6:
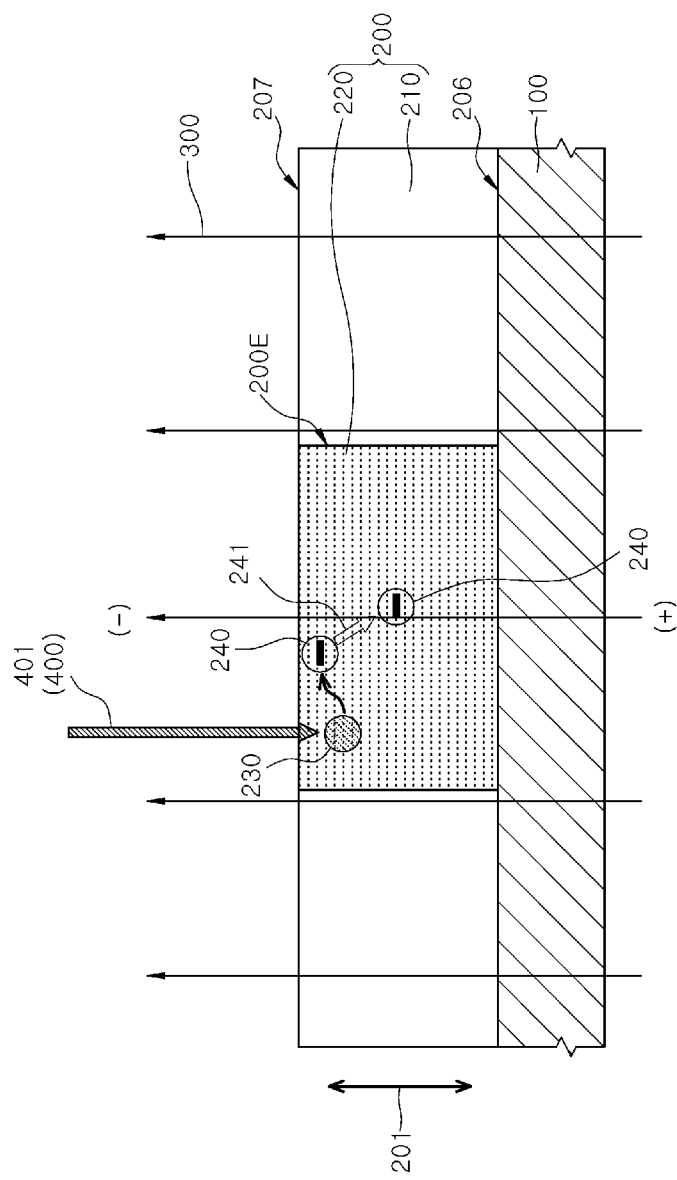
FIGS. 6 and 7 illustrate an effect of a method of forming a resist pattern according to an embodiment of the present disclosure.

FIG. 6 is a schematic view illustrating the movement 241 of primary electrons 240 by the electric field 300 according to an embodiment of the present disclosure.

Referring to FIG. 6, the EUV light 401 incident onto the exposed region 220 of the resist layer 200 may be partially absorbed by a resist component 230 of the resist layer 200. The EUV light 401 absorbed by the resist component 230 may then cause the primary electrons 240 to be emitted from the resist component 230. The emitted primary electrons 240 may each have a kinetic energy of approximately 80 eV or higher. The primary electrons 240 may be emitted in a direction generally perpendicular or perpendicular to the thickness direction 201 of the resist layer 200, that is, in a direction parallel to the surfaces 206 and 207 of the resist layer 200.

Because the electric field 300 is applied substantially perpendicularly to the resist layer 200, the emitted primary electrons 240 may be subjected to a force in the electric field direction of the electric field 300 to be moved as shown, as an example, by the movement 241. The primary electrons 240 may be accelerated in the electric field direction of the electric field 300. The primary electrons 240 may be excited to a higher energy state by the electric field 300. Because the primary electrons 240 are substantially constrained by the electric field 300 to move along the thickness direction 201 of the resist layer 200, the movement or diffusion of the primary electrons 240 to the non-exposed region 210 outside the exposed region 220 may be substantially limited by the electric field 300. Hence, diffusion of the primary electrons 240 outside the boundary 200E of the exposed region 220 may be limited.

Figure 7:
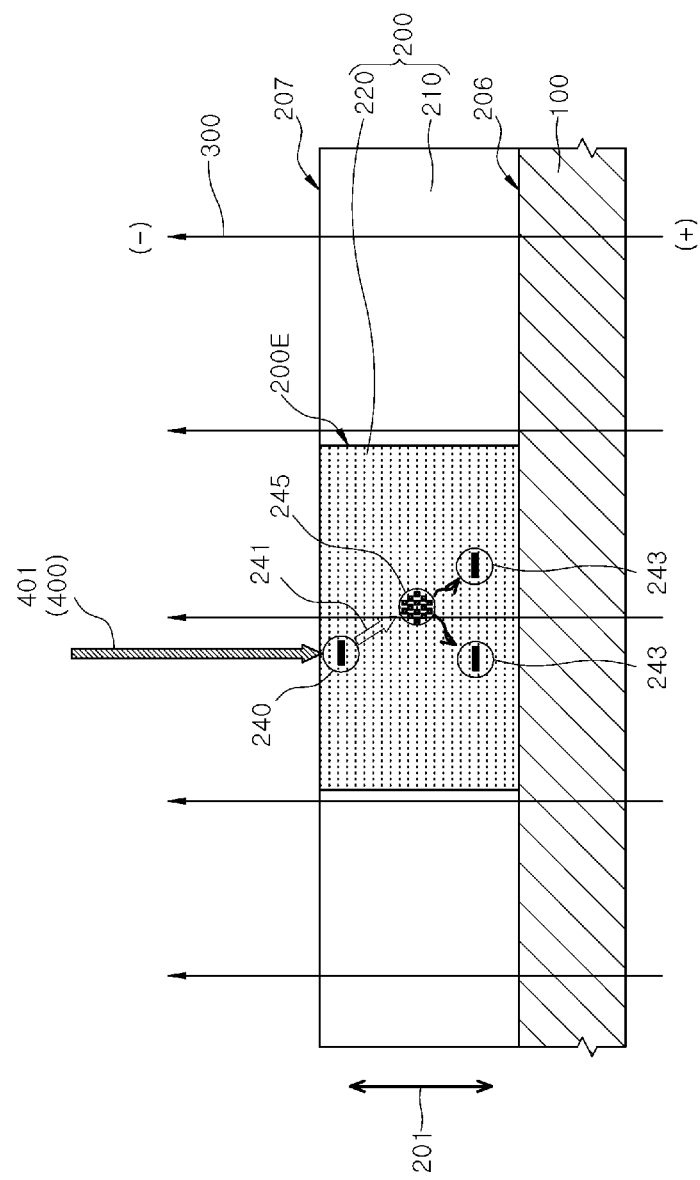

FIG. 7 is a schematic view illustrating a phenomenon of generation of secondary electrons 243 by the electric field 300 according to an embodiment of the present disclosure.

Referring to FIG. 7, the primary electrons 240 generated in the resist layer 200 by the EUV light 401 may collide elastically with other resist components 245 or other atoms, and secondary electrons 243 may be emitted by collision between the primary electrons 240 and another resist component 245. The secondary electrons 243 are emitted in an arbitrary direction, but may be constrained to move in the thickness direction 201 of the resist layer 200 by the applied electric field 300. Accordingly, scattering of the emitted secondary electrons 243 to the non-exposed region 210 outside the boundary 200E may be substantially limited, prevented, suppressed, or reduced.

Because the secondary electrons 243 may be excited to a higher energy state or the secondary electrons 243 may be accelerated by the electric field 300, the secondary electrons 243 may collide with the resist components 245 to further generate other secondary electrons 243. In this manner, the generation of the secondary electrons 243 may be increased by the electric field 300, so that the total number of primary electrons 240 and secondary electrons 243 generated by the EUV light 401 may be substantially increased. Even if the exposure dose of the EUV light 401 is constant, the number of electrons generated in the exposed region 220 of the resist layer 200 may be increased by the applied electric field 300. Further, both the secondary electrons 243 and the primary electrons 240 may be substantially limited, prevented, suppressed, or reduced from scattering into the non-exposed region 210 outside the boundary 200E by the applied electric field 300.

In this manner, unwanted exposure of the non-exposed region 210 may be reduced, thereby improving the line width roughness LWR or line edge roughness LER of the resist pattern (221 in FIG. 5). The applied electric field 300 may increase the number and energy of the secondary electrons 243 generated per primary electron 240, and the diffusion of the electrons 240 and 243 may be induced in the thickness direction of the resist layer 200. Accordingly, it is possible to induce increased exposure dose and reduced electron blur.

The applied electric field 300 may relatively increase the kinetic energy of the electrons in the resist layer 200, thereby reducing the mean free path of the electrons in the resist layer 200, and improving the critical dimension (CD) of the resist pattern 221.

The electric field 300 may limit the secondary electrons 243 and the primary electrons 240 to move only within the exposed region 220, so that an effect in which the dose for exposure is substantially increased may be induced. Because the effect of increasing the dose may be induced, the dose of the EUV light 400 actually required to expose the resist layer 200 to form the exposed region 220 may be relatively reduced.

Figure 8:
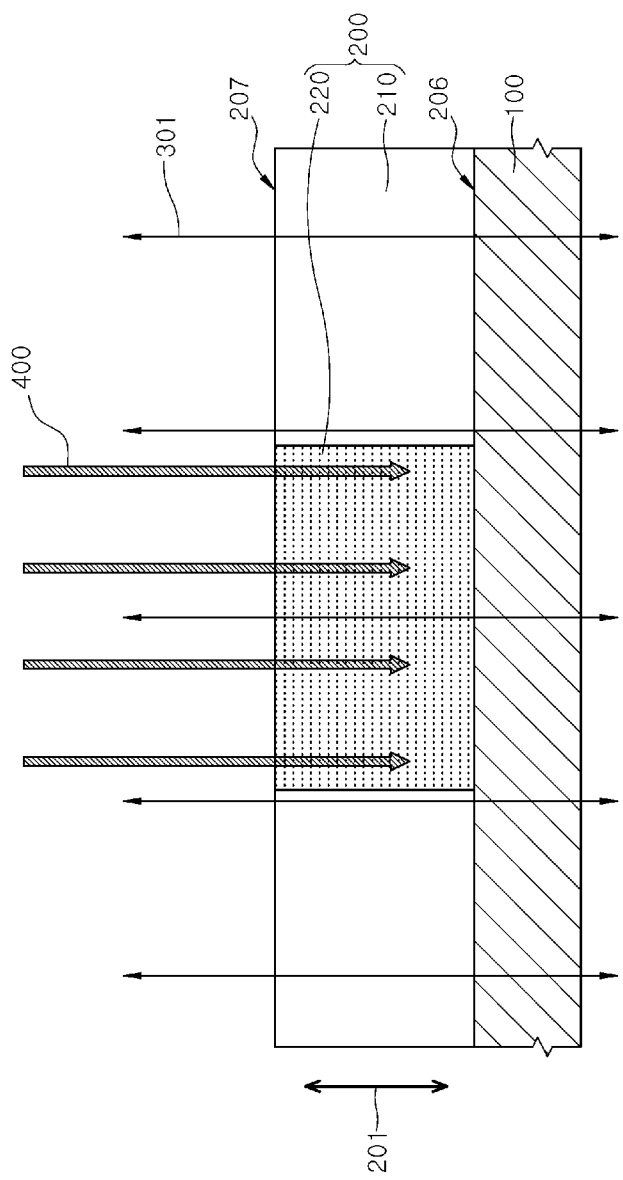
FIG. 8 illustrates an operation of applying an electric field by a method of forming a resist pattern according to an embodiment of the present disclosure.

FIG. 8 is a schematic cross-sectional view illustrating an operation S2 of applying an electric field 301 to the resist layer 200 in FIG. 1.

Referring to FIGS. 8 and 3, the electric field 301 applied to the resist layer 200 may be introduced so as to alternate vertically along the thickness direction 201 of the resist layer 200. The direction of the electric field may be changed so that the bottom surface 206 of the resist layer 200 has a positive potential with respect to the top surface 207 at a first time, and then, at a second time, the top surface 207 of the resist layer 200 has a positive potential with respect to the bottom surface 206. In this manner, the electric field 301 in which the direction of the electric field is alternately and repeatedly changed along the thickness direction 201 may be applied to the resist layer 200.

Figure 9:
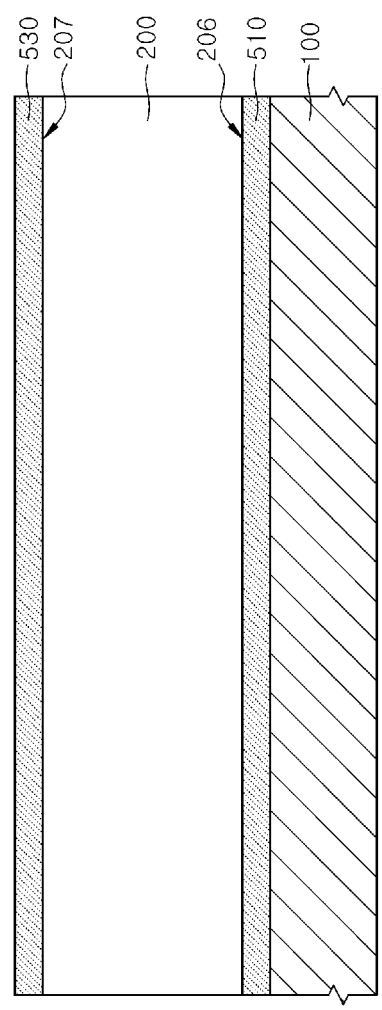
FIGS. 9 and 10 illustrate an operation of forming an electron blocking layer in a method of forming a resist pattern according to an embodiment of the present disclosure.

FIG. 9 is a schematic cross-sectional view illustrating an operation of forming electron blocking layers 510 and 530 in a method of forming a resist pattern according to an embodiment of the present disclosure.

Referring to FIG. 9, the first electron blocking layer 510 may be further formed at an interface between the resist layer 200 and the base layer 100. The first electron blocking layer 510 may be formed under the bottom surface 206 of the resist layer 200. The second electron blocking layer 530 may be formed on the top surface 207 of the resist layer 200. Each of the first and second electron blocking layers 510 and 530 may include a layer of a non-conductive material. Each of the first and second electron blocking layers 510 and 530 may include a layer of a different material (e.g., a dielectric material).

Figure 10:
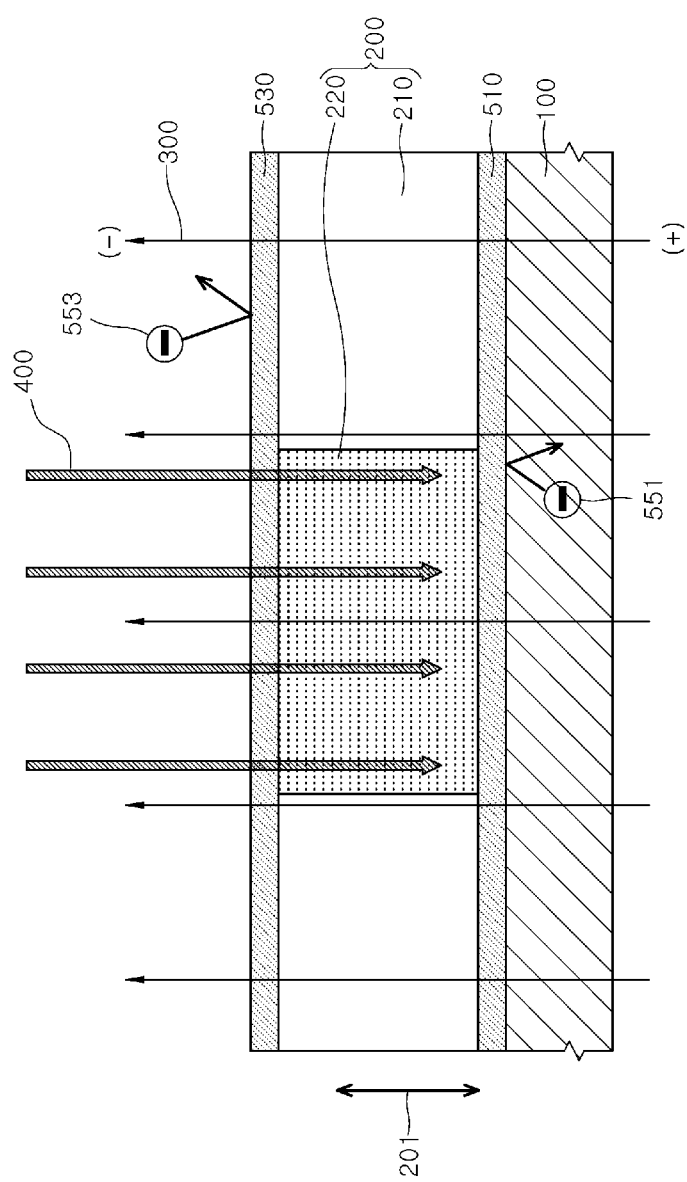

FIG. 10 is a schematic cross-sectional view illustrating operations of the electron blocking layers 510 and 530 in FIG. 9.

Referring to FIG. 10, the first electron blocking layer 510 may substantially prevent or reduce scattering of first external electrons 551 from the base layer 100 to the resist layer 200. The EUV light 400 irradiated to the resist layer 200 may be partially introduced and absorbed into the base layer 100 under the resist layer 200. The EUV light 400 introduced into the base layer 100 may generate the first external electrons 551 in the base layer 100. The first external electrons 551 may be affected by the electric field 300 applied to the resist layer 200 and may move from the base layer 100 to the resist layer 200. Because the first electron blocking layer 510 is a layer of a non-conductive material, the scattering or introduction of the first external electrons 551 into the resist layer 200 may be effectively prevented. Accordingly, it is possible to effectively prevent, suppress, or reduce exposure failure caused by the introduction of the first external electrons 551 into the non-exposed region 210 of the resist layer 200.

The second electron blocking layer 530 may substantially prevent or reduce the scattering of second external electrons 553 from the external environment to the resist layer 200. When irradiating the EUV light 400 onto the resist layer 200, the external environment may be an environment into which hydrogen (H) plasma is introduced. The second external electrons 553 may be induced in the external environment by the hydrogen (H) plasma, and the second external electrons 553 may be moved toward the resist layer 200 by the applied electric field 300. Because the second electron blocking layer 530 is a layer of a non-conductive material, the scattering or introduction of the second external electrons 553 into the resist layer 200 may be effectively prevented. Accordingly, it is possible to effectively prevent, suppress or reduce exposure failure caused by the introduction of the second external electrons 553 into the non-exposed region 210 of the resist layer 200.

Figure 11:
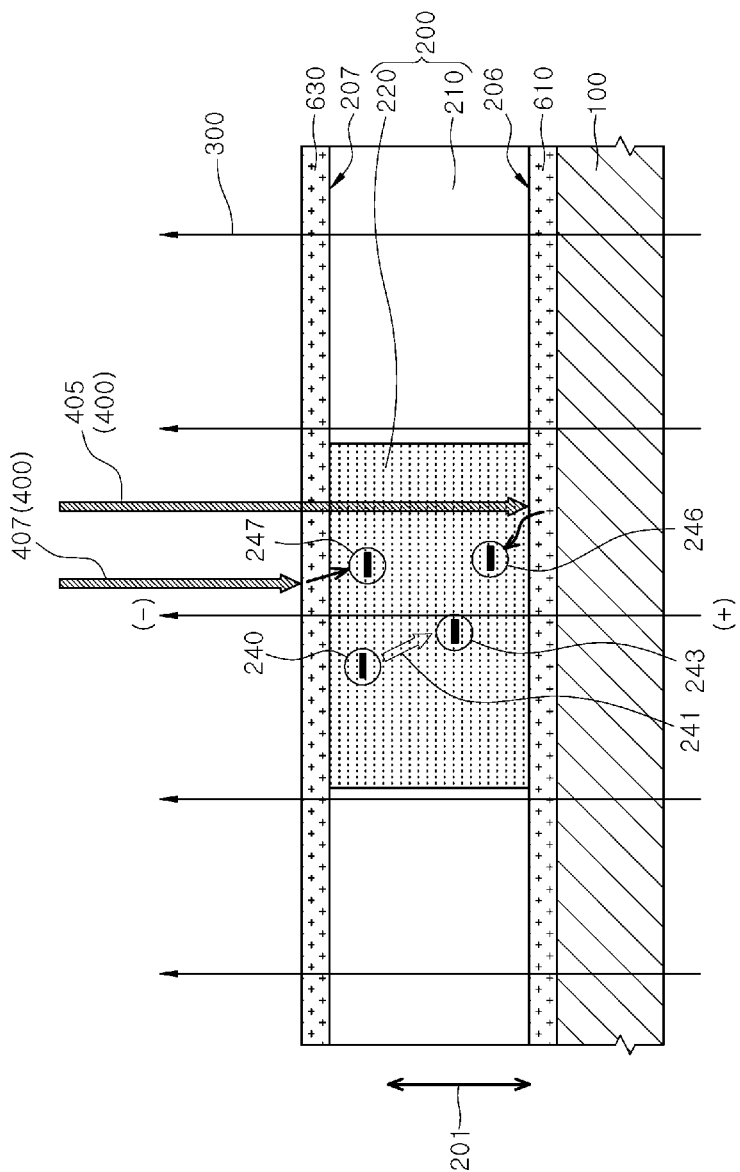
FIG. 11 illustrates an operation of forming a light absorbing layer in a method of forming a resist pattern according to an embodiment of the present disclosure.

FIG. 11 is a schematic cross-sectional view illustrating an operation of forming light absorbing layers 610 and 630 in a method of forming a resist pattern according to an embodiment of the present disclosure.

Referring to FIG. 11, the first light absorbing layer 610 may be further formed at the interface between the resist layer 200 and the base layer 100. The first light absorbing layer 610 may be formed under the bottom surface 206 of the resist layer 200. The second light absorbing layer 630 may be formed on the top surface 207 of the resist layer 200. Each of the first and second absorbing layers 610 and 630 may include a layer of a material having a higher absorption rate for the EUV light 400 than the resist layer 200. Each of the first and second absorbing layers 610 and 630 may include a layer of a conductive material. Each of the first and second absorbing layers 610 and 630 may include a layer of a non-conductive material.

Each of the first and second absorbing layers 610 and 630 may include a layer including indium (In), antimony (Sb), tin (Sn), tellurium (Te), iodine (I), bismuth (Bi), hafnium (Hf), zirconium (Zr), or titanium (Ti). Each of the first and second absorbing layers 610 and 630 may include a layer including a compound of a material such as indium (In), antimony (Sb), tin (Sn), tellurium (Te), iodine (I), bismuth (Bi), hafnium (Hf), zirconium (Zr), or titanium (Ti) and hydrogen (H), carbon (C), nitrogen (N), fluorine (F), or oxygen (O).

The first and second absorbing layers 610 and 630 may be layers that absorb the EUV light 400 and emit electrons 246 and 247 by the absorbed EUV light 400. As a portion 405 of the EUV light 400 transmitted through the resist layer 200 may be absorbed by the first absorbing layer 610, the first absorbing layer 610 may emit the first emission electrons 246 into the resist layer 200. Because the applied electric field 300 has the electric field direction along the thickness direction 201 of the resist layer 200, the first emission electrons 246 may be influenced by the applied electric field 300 and may flow into the resist layer 200. Because the direction in which the first emission electrons 246 may move is limited by the electric field 300, the scattering of the first emission electrons 246 into the non-exposed region 210 may be substantially prevented or suppressed.

As a portion 407 of the EUV light 400 irradiated to the resist layer 200 is absorbed by the second absorbing layer 630, the second absorbing layer 630 may emit the second emission electrons 247 into the resist layer 200. Because the applied electric field 300 has the electric field direction along the thickness direction 201 of the resist layer 200, the second emission electrons 247 may be influenced by the applied electric field 300 and may flow into the resist layer 200. The direction in which the second emission electrons 247 may move is limited by the electric field 300, so that the scattering of the second emission electrons 247 into the non-exposed region 210 may be substantially prevented or suppressed.

The emission electrons 246 and 247 emitted from the light absorbing layers 610 and 630 may flow into the exposed region 220 of the resist layer 200, so that the number of the electrons 240, 243, 246, and 247 distributed in the exposed region 220 may be increased. Because the number of the electrons 240, 243, 246, and 247 in the exposed region 220 is increased, it is possible to induce an effect similar to that of increasing the exposure dose.

Figure 12:
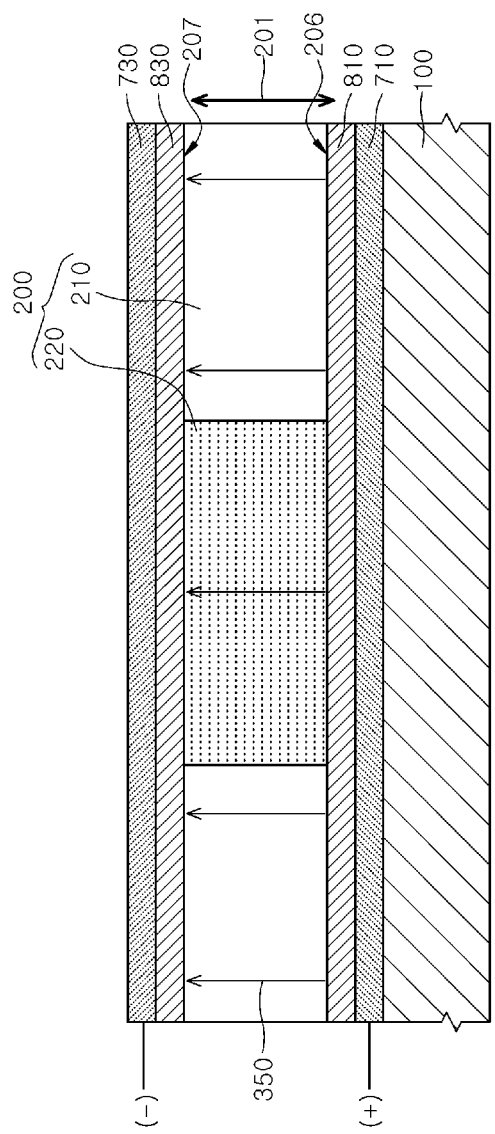
FIGS. 12 to 14 illustrate a method of forming a resist pattern according to an embodiment of the present disclosure.

FIG. 12 is a schematic cross-sectional view illustrating an operation of forming electrode layers 710 and 730 in a method of forming a resist pattern according to an embodiment of the present disclosure.

Referring to FIG. 12, a first electrode layer 710 may be formed on a base layer 100. The first electrode layer 710 may include a layer of a conductive material. The first electrode layer 710 may include a layer of a non-metallic conductive material such as a spin on carbon (SoC) layer. The first electrode layer 710 may include a layer of a metallic material. The first electrode layer 710 may be formed to have a thickness of approximately 1 nm to 100 nm. The first electrode layer 710 may be formed to have a thickness of approximately 10 nm. The first electrode layer 710 may be formed to have a thickness thinner than that of the resist layer 200.

A first insulating layer 810 may be formed on the first electrode layer 710. The first insulating layer 810 may include a layer of a non-conductive material. The first insulating layer 810 may include a spin on dielectric (SoD) layer. The first insulating layer 810 may serve to block the movement of electrons from the first electrode layer 710 to the resist layer 200. The first insulating layer 810 may be formed to have a thickness thinner than that of the resist layer 200.

The resist layer 200 may be formed on the first insulating layer 810.

A second insulating layer 830 may be formed on the resist layer 200. A second electrode layer 730 similar or identical to the first electrode layer 710 may be formed on the second insulating layer 830. The first insulating layer 810 may be formed at an interface between the bottom surface 206 of the resist layer 200 and the first electrode layer 710. The second insulating layer 830 may be formed at an interface between the top surface 207 of the resist layer 200 and the second electrode layer 730.

A potential difference may be applied between the first and second electrode layers 710 and 730 to apply an electric field 350 to the resist layer 200 in a thickness direction 201 of the resist layer 200.

Figure 13:
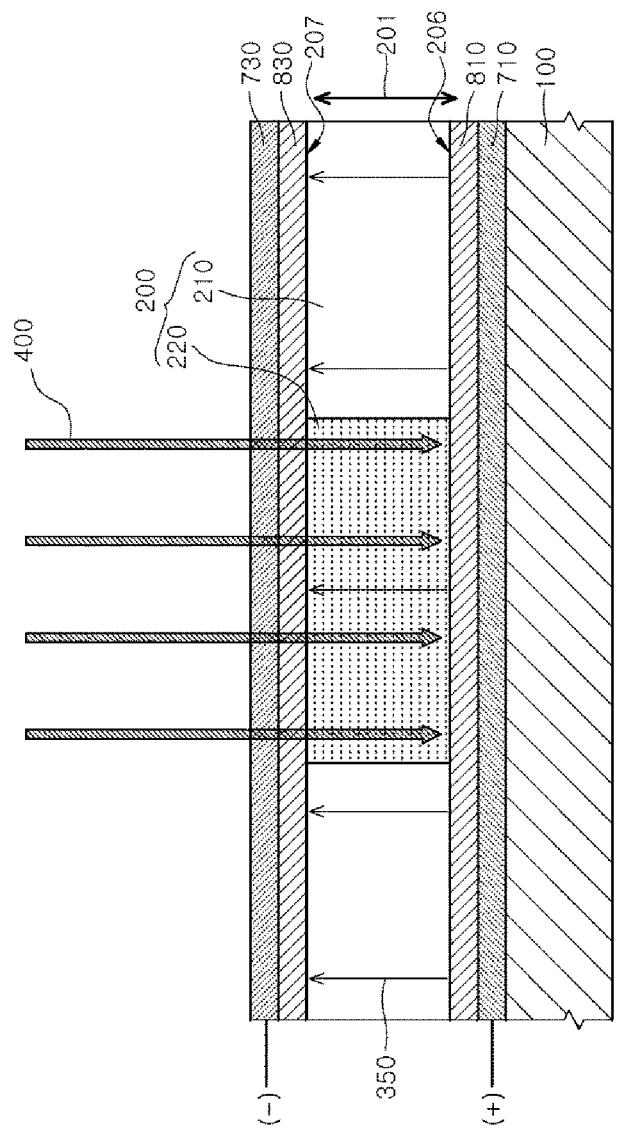

FIG. 13 is a schematic cross-sectional view illustrating an operation of exposing the resist layer 200 in the method of forming a resist pattern according to an embodiment of the present disclosure.

Referring to FIG. 13, while applying the electric field 350 to the resist layer 200 through the first and second electrode layers 710 and 730, a portion of the resist layer 200 may be exposed to the EUV light 400. The EUV light 400 may be selectively irradiated onto the exposed region 220 of the resist layer 200.

Figure 14:
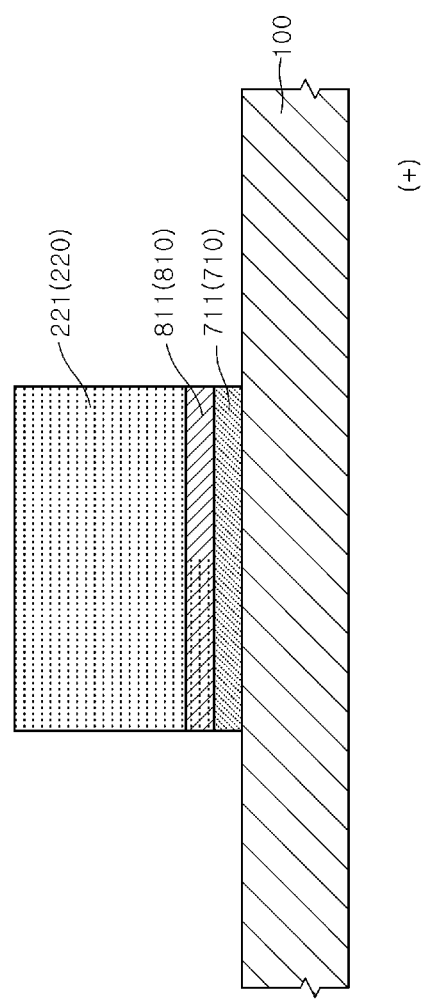

FIG. 14 is a schematic cross-sectional view illustrating an operation of forming the resist pattern 221 in a method of forming a resist pattern according to an embodiment.

Referring to FIG. 14, the exposed region 220 of the resist layer 200 may be developed to form the resist pattern 221. Before developing the exposed region 220 of the resist layer 200, the resist layer 200 may be post-baked. In addition, the second electrode layer (730 in FIG. 13) and the second insulating layer (830 in FIG. 13) may be selectively removed. Thereafter, the non-exposed region (210 of FIG. 13) of the resist layer 200 may be developed and removed. Accordingly, the exposed region 220 may be patterned into a resist pattern 221. Thereafter, the portions of the first insulating layer 810 and the first electrode layer 710 exposed without being covered by the resist pattern 221 may be selectively removed, so that a first insulating layer pattern 811 and a first electrode layer pattern 711 overlapping with the resist pattern 211 may be formed.

Figure 15:
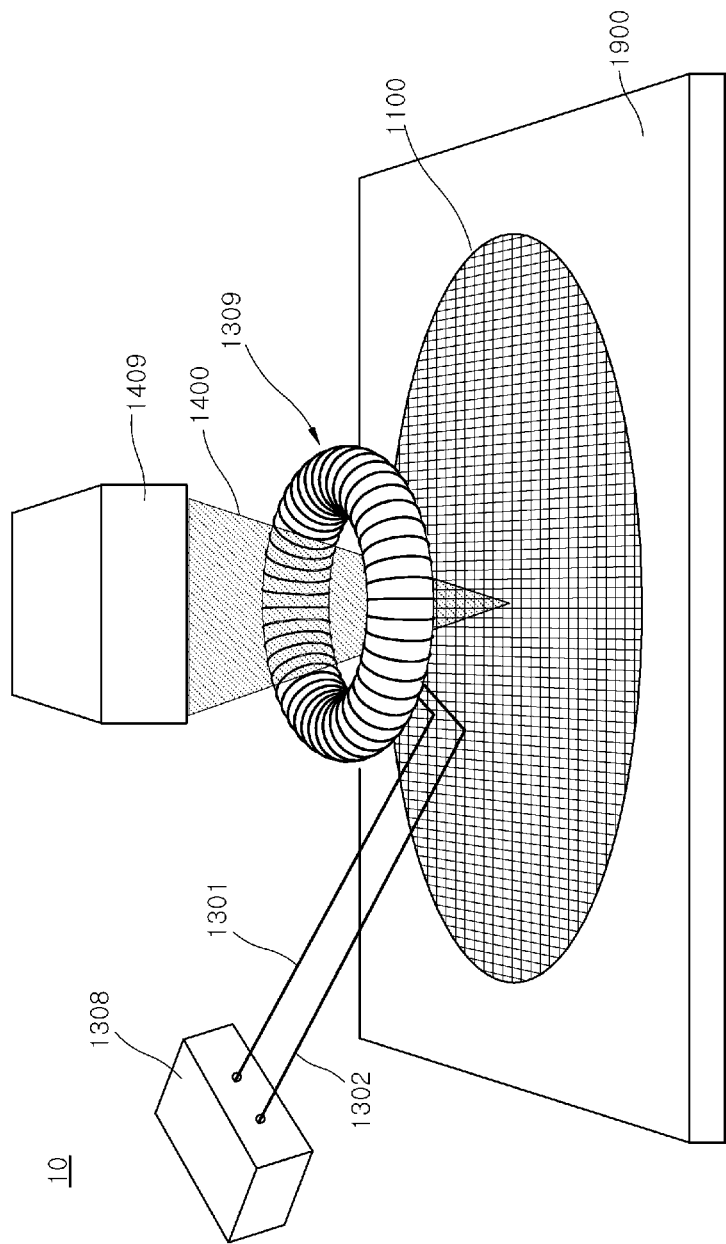
FIGS. 15 to 21 illustrate apparatuses for forming a resist pattern according to an embodiment of the present disclosure.
Figure 16:
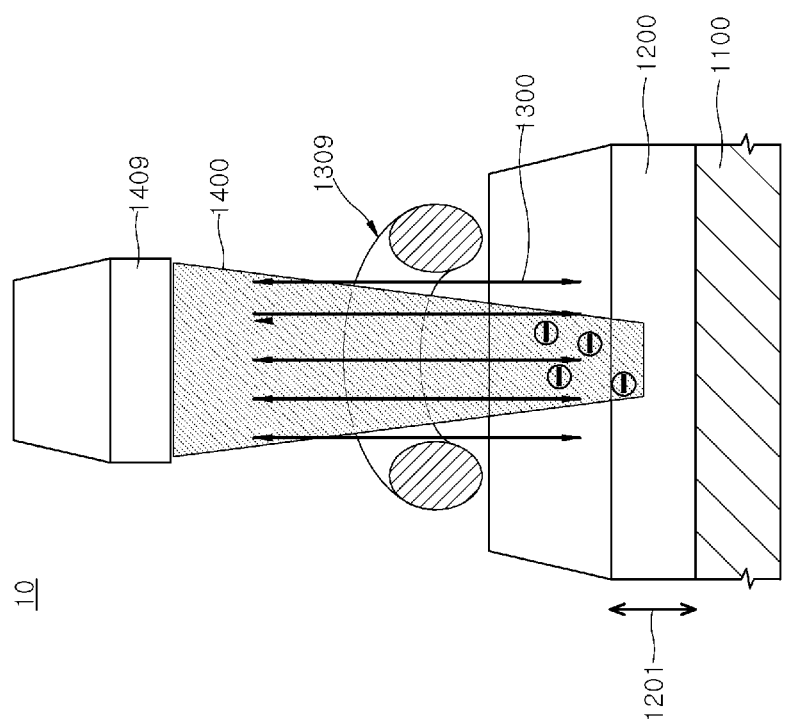

FIGS. 15 and 16 are schematic views illustrating an apparatus 10 for forming a resist pattern according to an embodiment of the present disclosure.

Referring to FIGS. 15 and 16, the apparatus 10 for forming a resist pattern may be configured as a process apparatus by which the methods of forming a resist pattern described with reference to FIGS. 1 to 11 are performed. The apparatus 10 for forming a resist pattern may further include electric field forming parts 1308 and 1309 in addition to the configuration of an EUV exposure apparatus. The apparatus 10 for forming a resist pattern may include a chuck part 1900, an exposure part 1409, and the electric field forming parts 1308 and 1309.

The chuck part 1900 may be configured as a supporter that holds a base layer 1100. The chuck part 1900 may be configured as an electrostatic chuck (ESC) for holding a wafer or a substrate that may be introduced as the base layer 1100. The base layer 1100 may be mounted on the chuck part 1900 with a resist layer 1200 formed thereon.

The exposure part 1409 may be configured to expose a portion of the resist layer 1200 with EUV light 1400. The exposure part 1409 may be configured as an EUV exposure unit.

The electric field forming parts 1308 and 1309 may be configured to apply an electric field 1300 to the resist layer 1200 in a thickness direction 1201 of the resist layer 1200. The electric field forming parts 1308 and 1309 may include a power supply 1308 and a toroidal coil 1309. The toroidal coil 1309 may be disposed between the exposure part 1409 and the resist layer 1200. The toroidal coil 1309 may be disposed over the resist layer 1200 to apply the electric field 1300 to the resist layer 1200. The EUV light 1400 may pass through an inner space of the toroidal coil 1309 and may be irradiated onto the resist layer 1200 to expose a portion of the resist layer 1200 so that electrons may be generated in the resist layer 1200.

The toroidal coil 1309 may be configured to operate so that the electric field 1300 is applied in a direction substantially perpendicular to a surface of the resist layer 1200. The power supply 1308 may be configured to control the toroidal coil 1309 to apply the electric field 1300 to the resist layer 1200. The power supply 1308 may operate to flow a current to the toroidal coil 1309 through an input terminal 1301 and an output terminal 1302 of the toroidal coil 1309. The power supply 1308 may be configured to flow a varying current to the toroidal coil 1309 so that the intensity and direction of the current flowing through the toroidal coil 1309 may change over time.

Figure 17:
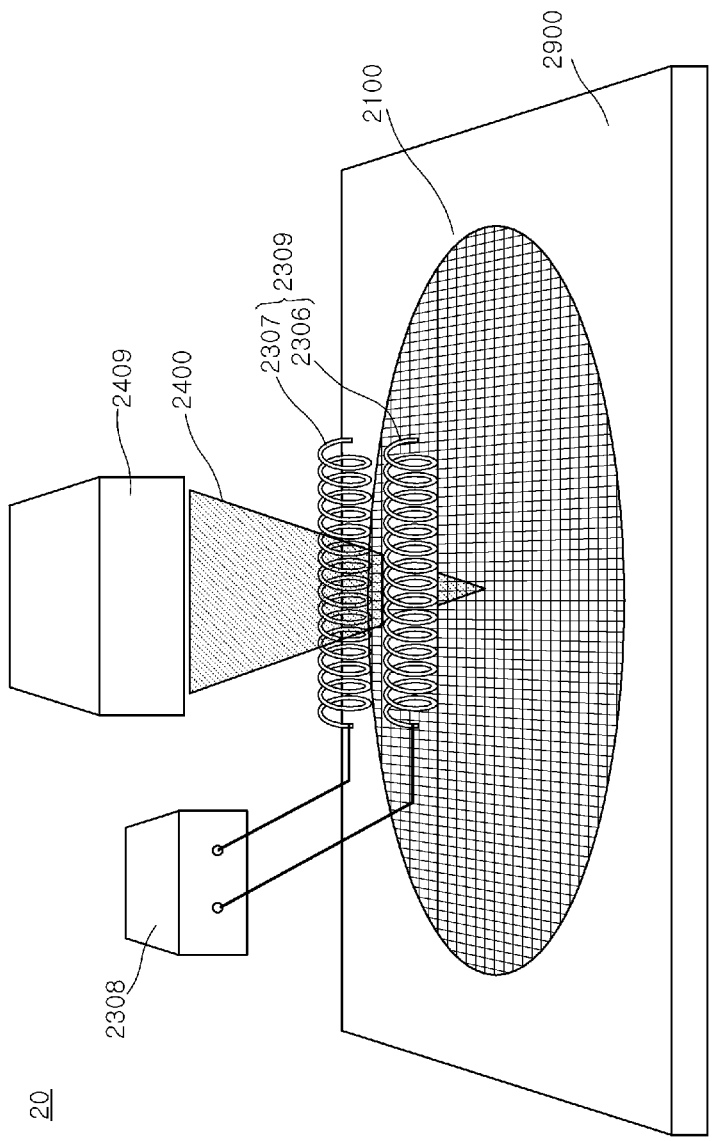
Figure 18:
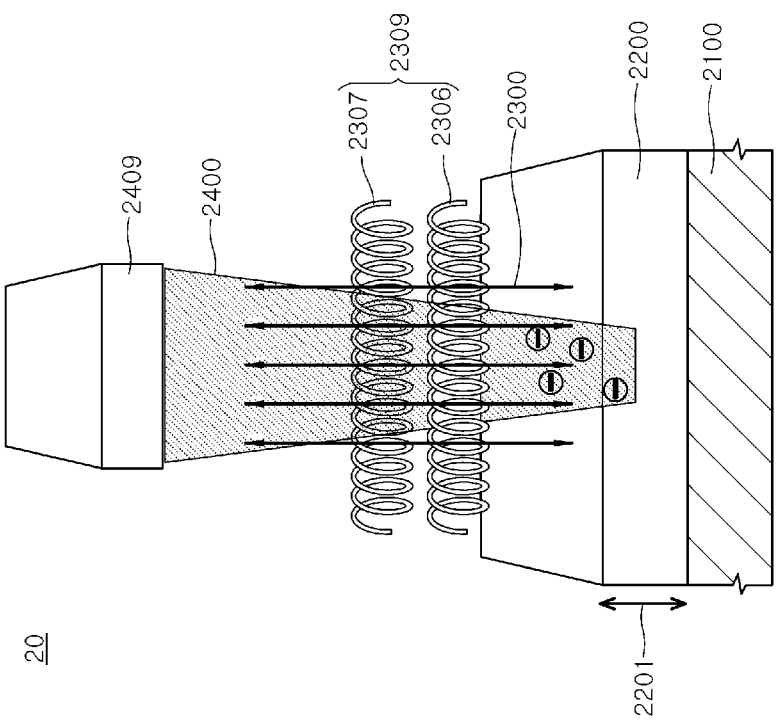

FIGS. 17 and 18 are schematic views illustrating an apparatus 20 for forming a resist pattern according to an embodiment of the present disclosure.

Referring to FIGS. 17 and 18, the apparatus 20 for forming a resist pattern may be configured as a process apparatus by which the method of forming a resist pattern described with reference to FIGS. 1 to 11 is performed. The apparatus 20 for forming a resist pattern may further include electric field forming parts 2308 and 2309 in addition to the configuration of an EUV exposure apparatus. The apparatus 20 for forming a resist pattern may include a chuck part 2900, an exposure part 2409, and the electric field forming parts 2308 and 2309.

The chuck part 2900 may be configured as a supporter that holds a base layer 2100. The chuck part 2900 may be configured as an electrostatic chuck (ESC) for holding a wafer or a substrate that may be introduced as the base layer 2100. The base layer 2100 may be mounted on the chuck part 2900 with a resist layer 2200 formed thereon.

The exposure part 2409 may be configured to expose a portion of the resist layer 2200 with EUV light 2400. The exposure part 2409 may be configured as an EUV exposure unit.

The electric field forming parts 2308 and 2309 may be configured to apply an electric field 2300 to the resist layer 2200 in a thickness direction 2201 of the resist layer 2200. The electric field forming parts 2308 and 2309 may include solenoids 2309 and a power supply 2308. The solenoids 2309 may include a first solenoid 2306 and a second solenoid 2307 that are disposed to face each other. The first and second solenoids 2306 and 2307 may be positioned parallel to each other and over one another. The solenoids 2309 may be disposed between the exposure part 2409 and the resist layer 2200. The solenoids 2309 may be disposed over the resist layer 2200 to apply the electric field 2300 to the resist layer 2200. The EUV light 2400 may pass through inner spaces of the first and second solenoids 2306 and 2307 and may be irradiated onto the resist layer 2200 to expose a portion of the resist layer 2200 so that electrons may be generated in the resist layer 2200.

The solenoids 2309 may operate so that the electric field 2300 is applied in a direction substantially perpendicular to a surface of the resist layer 2200. The power supply 2308 may be configured to control the solenoids 2309 to apply the electric field 2300 to the resist layer 2200. The power supply 2308 may operate to flow a current to the solenoids 2309. The power supply 2308 may flow currents to each of the first and second solenoids 2306 and 2307 in opposite directions so that the currents flowing through the first and second solenoids 2306 and 2307 have opposite directions. Alternatively, the first and second solenoids 2306 and 2307 may be composed of coils wound in opposite directions, and accordingly, the current may flow through the first and second solenoids 2306 and 2307 in opposite directions even if the current flow to each of the first and second solenoids 2306 and 2307 in the same direction. The power supply 2308 may be configured to flow a varying current to the first and second solenoids 2306 and 2307 so that the intensity and direction of the current flowing through the first and second solenoids 2306 and 2307 change over time.

Figure 19:
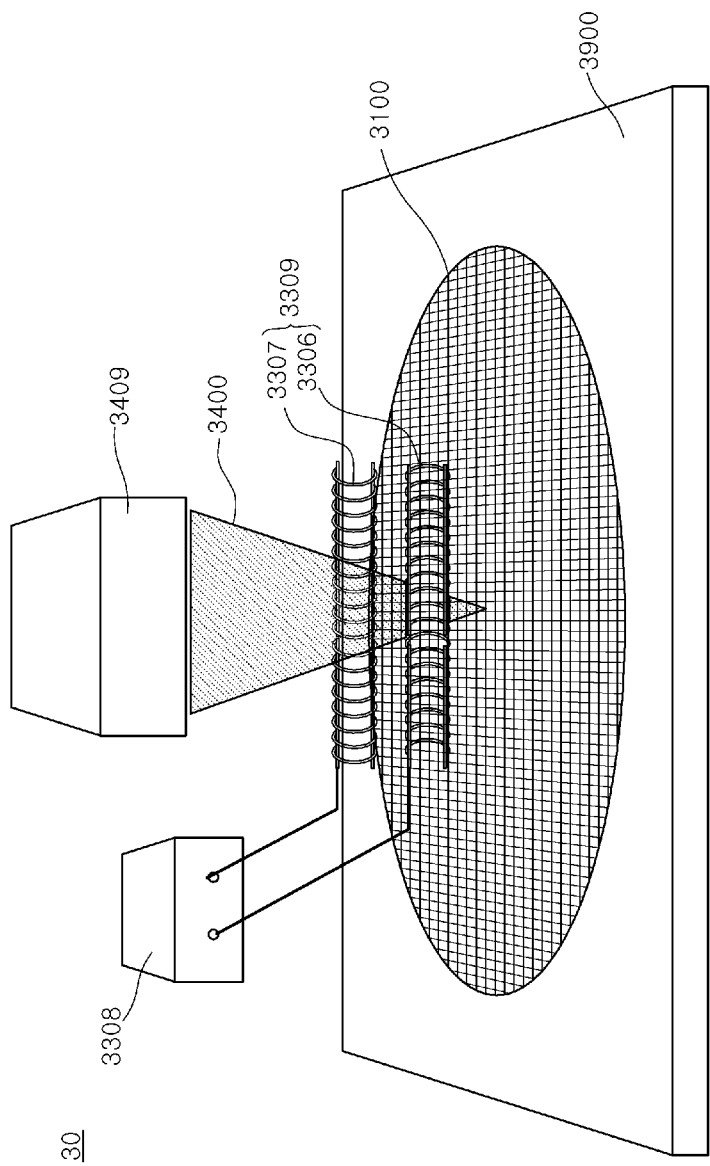
Figure 20:
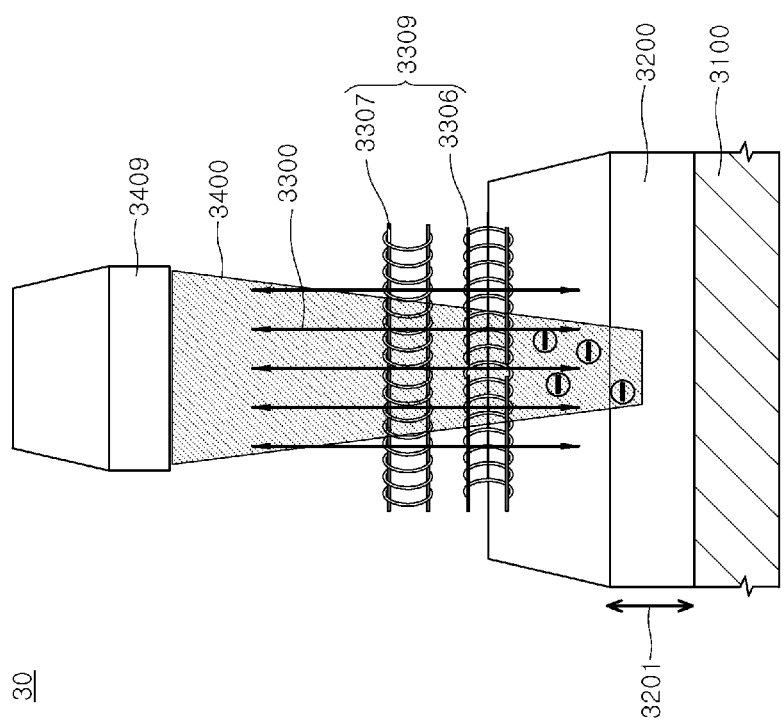

FIGS. 19 and 20 are schematic views illustrating an apparatus 30 for forming a resist pattern according to an embodiment of the disclosure.

Referring to FIGS. 19 and 20, the apparatus 30 for forming a resist pattern may be configured as a process apparatus by which the methods of forming resist patterns described with reference to FIGS. 1 to 11 are performed. The apparatus 30 for forming a resist pattern may include electric field forming parts 3308 and 3309 in addition to the configuration of an EUV exposure apparatus. The apparatus 30 for forming a resist pattern may include a chuck part 3900, an exposure part 3409, and electric field forming parts 3308 and 3309.

The chuck part 3900 may be configured as a supporter that holds a base layer 3100. The chuck part 3900 may be configured as an electrostatic chuck (ESC) for holding a wafer or a substrate that may be introduced onto the base layer 3100. The base layer 3100 may be mounted on the chuck part 3900 with a resist layer 3200 formed thereon.

The exposure part 3409 may be configured to expose a portion of the resist layer 3200 with EUV light 3400. The exposure part 3409 may be configured as an EUV exposure unit.

The electric field forming parts 3308 and 3309 may be configured to apply an electric field 3300 to the resist layer 3200 in a thickness direction 3201 of the resist layer 3200. The electric field forming parts 3308 and 3309 may include wire arrays 3309 and a power supply 3308. The wire arrays 3309 may include a first wire array 3306 and a second wire array 3307 that are disposed to face each other. The wire arrays 3309 may be disposed between the exposure part 3409 and the resist layer 3200. The wire arrays 3309 may be disposed over the resist layer 3200 to apply the electric field 3300 to the resist layer 3200. The EUV light 3400 may passe through inner spaces of the first and second wire arrays 3306 and 3307 and may be irradiated to the resist layer 3200 to expose a portion of the resist layer 3200 so that electrons are generated in the resist layer 3200.

The wire arrays 3309 may operate so that the electric field 3300 is applied in a direction substantially perpendicular to a surface of the resist layer 3200. The power supply 3308 may be configured to control the arrays 3309 to apply the electric field 3300 to the resist layer 3200. The power supply 3308 may operate to flow a current to the wire arrays 3309. The power supply 3308 may flow currents in opposite directions to each of the first and second wire arrays 3306 and 3307 so that the currents flowing through the first and second wire arrays 3306 and 3307 have opposite directions. The power supply 3308 may be configured to flow a varying current to the first and second wire arrays 3306 and 3307 so that the intensity and direction of the current flowing through the first and second wire arrays 3306 and 3307 change over time.

Figure 21:
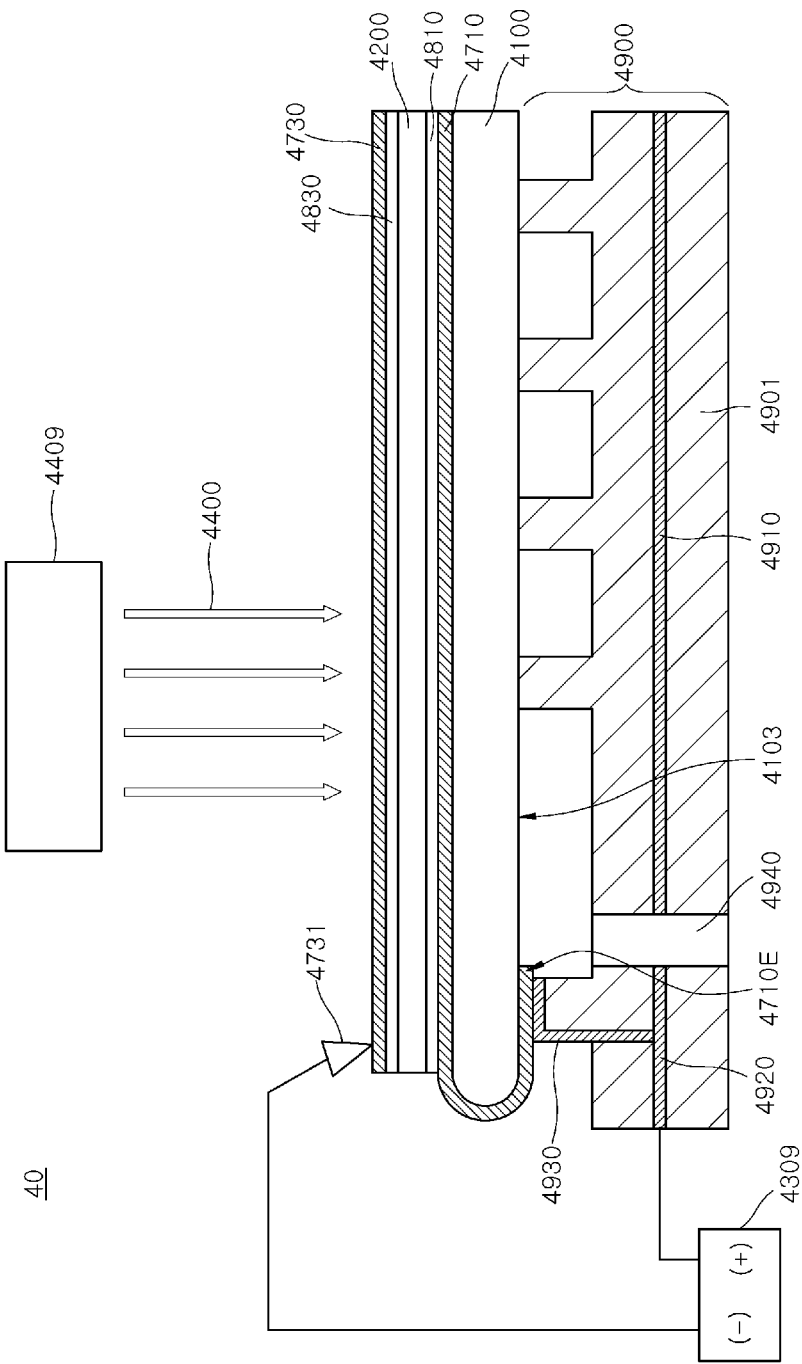

FIG. 21 is a schematic view illustrating an apparatus 40 for forming a resist pattern according to an embodiment of the present disclosure.

Referring to FIG. 21, the apparatus 40 for forming a resist pattern may be configured as a process apparatus by which the methods of forming a resist pattern described with reference to FIGS. 12 to 14 are performed. The apparatus 40 for forming a resist pattern may include an electric field forming part 4309 in addition to the configuration of an EUV exposure apparatus. The apparatus 40 for forming a resist pattern may include a chuck part 4900, an exposure part 4409, and the electric field forming part 4309.

The chuck part 4900 may be configured as a supporter for holding a substrate 4100 which may be a base layer. The chuck part 4900 may be configured as an electrostatic chuck (ESC) for absorbing a bottom surface 4103 of the substrate 4100 to hold the substrate 4100. The chuck part 4900 may include an ESC electrode 4910 in a chuck body 4901.

A resist layer 4200 may be disposed on the substrate 4100. A first electrode layer 4710 may be disposed between the resist layer 4200 and the substrate 4100, and a first insulating layer 4810 may be disposed between the first electrode layer 4710 and the resist layer 4200. A second electrode layer 4730 may be disposed over the resist layer 4200, and a second insulating layer 4830 may be disposed between the resist layer 4200 and the second electrode layer 4730. The first electrode layer 4710 may further extend past a side edge of the substrate 4100 so that the extended portion 4710E is positioned between the substrate 4100 and the chuck part 4900. The chuck part 4900 may be configured to further include a third electrode 4930 contacting the extended portion 4710E of the first electrode layer 4710. The chuck part 4900 may be configured to further include a fourth electrode 4920 from which the third electrode 4930 extends, and further include an insulating layer 4940 for insulating the fourth electrode 4920 from the ESC electrode 4910.

The electric field forming part 4309 may apply a potential difference between the second electrode layer 4730 and the first electrode layer 4710 to form an electric field in the resist layer 4200. The electric field forming part 4309 may be configured to apply a negative potential to the second electrode layer 4730 through a contact electrode 4731 contacting the second electrode layer 4730 and to apply a positive potential to the first electrode layer 4710 through the fourth electrode 4920 and the third electrode 4930. Conversely, the electric field forming part 4309 may be configured to apply a positive potential to the second electrode layer 4730 through the contact electrode 4731 contacting the second electrode layer 4730 and to apply a negative potential to the first electrode layer 4710 through the fourth electrode 4920 and the third electrode 4930.

According to various embodiments of the present disclosure, a resist pattern may be formed by exposing a resist layer with EUV light while applying an electric field to the resist layer. The resist pattern may have improved line width roughness LWR or line edge roughness LER.

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the inventive concept is not limited to the above descriptions but defined by the accompanying claims, and all of distinctive features in the equivalent scope should be construed as being included in the inventive concept.

What is claimed is:

1. A method of forming a resist pattern, the method comprising:
    forming a resist layer on a base layer;
    forming a first electron blocking layer at an interface between the resist layer and the base layer to block a movement of electrons from the base layer to the resist layer, wherein the first electron blocking layer is non-conductive;
    applying an electric field to the resist layer in a thickness direction of the resist layer; and
    exposing a portion of the resist layer with extreme ultraviolet (EUV) light while applying the electric field.

2. The method of claim 1, wherein the electric field is applied to the resist layer so that a bottom surface of the resist layer has a positive potential with respect to a top surface of the resist layer.

3. The method of claim 2, further comprising changing a direction of the electric field so that the top surface of the resist layer has a positive potential with respect to the bottom surface of the resist layer.

4. The method of claim 1, wherein the electric field is applied to the resist layer so that a bottom surface of the resist layer has a negative potential with respect to a top surface of the resist layer.

5. The method of claim 1, wherein the first electron blocking layer includes a layer of a dielectric material.

6. The method of claim 1, further comprising forming a second electron blocking layer that covers a top surface of the resist layer.

7. The method of claim 1, further comprising forming a second absorption layer on a top surface of the resist layer, the second absorption layer having a higher absorption rate of the EUV light than the resist layer.

8. The method of claim 1, wherein the applying of the electric field includes:
arranging a toroidal coil over the resist layer;
flowing a current through the toroidal coil; and
changing an intensity and direction of the current over time.

9. The method of claim 1, wherein the applying of the electric field includes:
arranging solenoids facing each other over the resist layer; and
flowing currents through the solenoids with directions of the currents being opposite to each other.

10. The method of claim 1, wherein the applying of the electric field includes:
arranging wire arrays facing each other over the resist layer; and
flowing a current through the wire arrays.

11. A method of forming a resist pattern, the method comprising:
forming a resist layer on a base layer;
forming a first absorption layer at an interface between the resist layer and the base layer, wherein the first absorption layer includes one selected from the group consisting of indium (In), antimony (Sb), tin (Sn), tellurium (Te), iodine (I), bismuth (Bi), hafnium (Hf), zirconium (Zr), and titanium (Ti);
applying an electric field to the resist layer in a thickness direction of the resist layer; and
exposing a portion of the resist layer with extreme ultraviolet (EUV) light while applying the electric field.

12. The method of claim 11, wherein the first absorption layer has a higher absorption rate of the EUV light than the resist layer.

13. A method of forming a resist pattern, the method comprising:
forming a first electrode layer on a base layer;
forming a resist layer on the first electrode layer;
forming a second electrode layer on the resist layer;
applying a potential difference between the first and second electrode layers to apply an electric field to the resist layer in a thickness direction of the resist layer; and
exposing a portion of the resist layer with extreme ultraviolet (EUV) light while applying the electric field,
wherein the first electrode layer is positioned between the base layer and the resist layer, and
forming a first insulating layer between the resist layer and the first electrode layer to block a movement of electrons from the first electrode layer to the resist layer.

14. The method of claim 13, wherein the first insulating layer includes a layer of a dielectric material.

15. The method of claim 13, further comprising forming a second insulating layer at an interface between the resist layer and the second electrode layer.

16. The method of claim 13, wherein the first electrode layer includes a spin-on carbon (SoC) layer.

17. An apparatus for forming a resist pattern, the apparatus comprising:
a chuck part configured to hold a base layer including a first electrode layer, a resist layer, and a second electrode layer formed thereon;
an exposure part configured to expose a portion of the resist layer with extreme ultraviolet (EUV) light;
an electric field forming part configured to apply a potential difference between the first and second electrode layers to apply an electric field to the resist layer in a thickness direction of the resist layer; and
a third electrode configured to electrically connect an extended portion of the first electrode layer to the electric field forming part, wherein the first electrode layer extends so that the extended portion is positioned between the base layer and the chuck portion, and the chuck portion contacts the extended portion of the first electrode layer.

* * * * *